United States Patent
Feng et al.

(10) Patent No.: US 6,842,044 B1
(45) Date of Patent: Jan. 11, 2005

(54) GLITCH-FREE RECEIVERS FOR BI-DIRECTIONAL, SIMULTANEOUS DATA BUS

(75) Inventors: Kai D. Feng, Essex Junction, VT (US); Hongfei Wu, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/692,192

(22) Filed: Oct. 23, 2003

(51) Int. Cl.$^7$ ............................................ H03K 19/0175
(52) U.S. Cl. ............................. 326/82; 326/59; 326/22
(58) Field of Search ............................. 326/22, 23, 26, 326/27, 59, 82, 83, 86

(56) References Cited

U.S. PATENT DOCUMENTS

| | | |
|---|---|---|
| 4,105,980 A | 8/1978 | Cowardin et al. |
| 5,289,060 A | 2/1994 | Elnashar et al. |
| 5,467,041 A | 11/1995 | Baba et al. |
| 5,604,450 A | 2/1997 | Borkar et al. |
| 6,025,744 A | 2/2000 | Bertolet et al. |
| 6,118,829 A * | 9/2000 | North .......................... 375/317 |
| 6,144,786 A | 11/2000 | Chethik |
| 6,405,093 B1 * | 6/2002 | Malcolm et al. ............... 700/94 |
| 6,405,228 B1 | 6/2002 | Williams et al. |
| 6,535,057 B2 | 3/2003 | Chakravarthy |
| 2001/0048341 A1 | 12/2001 | Chakravarthy |

FOREIGN PATENT DOCUMENTS

| | | |
|---|---|---|
| JP | 63-254827 | 10/1988 |
| JP | 04-213922 | 8/1992 |
| JP | 04-259114 | 9/1992 |

OTHER PUBLICATIONS

Mooney et al., A 900 Mb/s Bidirectional Signaling Scheme; IEEE Journal of Solid–State Circuits, vol. 30, No. 12, Dec. 1995, pp. 1538–1543.

* cited by examiner

*Primary Examiner*—Don Le
(74) *Attorney, Agent, or Firm*—Schmeiser, Olsen & Watts; William H. Steinberg

(57) ABSTRACT

A structure and method for eliminating glitches at the output of a receiver receiving signals sent to one end of a bi-directional, simultaneous transmission line. The receiver comprises two comparators, a logic circuit, a glitch detector, and a programmable delay unit. The two comparators convert a three-state digital signal on the transmission line into two two-state digital signals so that the logic circuit can understand. When a glitch occurs at the output of the logic circuit, also the output of the receiver, caused by the transitions on the output of one of the comparators and a first signal being sent to the other end of the transmission line reaching the logic circuit not at the same time, the glitch detector causes the programmable delay unit to adjust delay to the propagation path of the first signal to the logic circuit so as to eliminate the cause of the glitch.

20 Claims, 7 Drawing Sheets

GLITCH-FREE RECEIVERS FOR BI-DIRECTIONAL, SIMULTANEOUS DATA BUS

BACKGROUND OF THE INVENTION

1. Technical Field

The present invention relates to bi-directional, simultaneous data buses, and more specifically, to glitch-free receivers for simultaneous, bi-directional data buses.

2. Related Art

Typically, on a bi-directional, simultaneous data bus, data is sent in both directions simultaneously. In a typical arrangement, for each physical transmission line of the bi-directional, simultaneous data bus, the output of a first driver and the input of a first receiver are electrically coupled to the first end of the transmission line, and the output of a second driver and the input of a second receiver are electrically coupled to the second end of the transmission line.

The first receiver interprets the digital signal being sent by the second driver from the second end to the first end of the transmission line by monitoring both the digital signal on the input of the first driver and the voltage level on the first end of the transmission line. Similarly, the second receiver interprets the digital signal being sent by the first driver from the first end to the second end of the transmission line by monitoring both the digital signal on the input of the second driver and the voltage level on the second end of the transmission line.

Assume that the inputs of the first and second drivers are initially at logic low and logic high, respectively (i.e., 0 and 1, respectively, in positive logic convention). Hereafter, positive logic convention is used. As a result, the first end of the transmission line is at ½Vcc (Vcc is the power supply voltage). Assume further that the input of the first driver switches from 0 to 1 while the input of the second driver is held at 1. In response, the first end of the transmission line is pulled from ½Vcc to Vcc. Hereafter, 0 and 1 represent logic statuses of digital signals, and analog voltage such as 0V, ground, Vcc, ½Vcc, etc., represent values of analog signals. Eventually, the first receiver will sense both the digital signal on the input of the first driver switching from 0 to 1 and the voltage level on the first end of the transmission line switching to Vcc. As a result, after the input of the first driver switches from 0 to 1, eventually, the first receiver will correctly interpret that a 1 is still being sent by the second driver from the second end to the first end of the transmission line. Accordingly, the first receiver generates a 1 at its output representing the logic value the second driver is sending from the second end to the first end of the transmission line.

However, there may be a time period during which the first receiver has sensed the digital signal on the input of the first driver switching from 0 to 1, but has not sensed the voltage level on the first end of the transmission line switching to from ½Vcc to Vcc. During this period, the first receiver incorrectly interprets that a 0 is being sent by the second driver from the second end to the first end of the transmission line. At the end of the time period, the first receiver senses the voltage level on the first end of the transmission line switching from ½Vcc to Vcc. Then, the first receiver will correctly interpret that a 1 is being sent by the second driver from the second end to the first end of the transmission line. In other words, there is a glitch during this time period.

As a result, a design of a receiver that is capable of eliminating glitches at its output is needed. A method is also needed for programming and operating the receiver so that glitches at its output are eliminated.

SUMMARY OF THE INVENTION

The present invention provides a receiver, comprising (a) a first means for receiving as inputs a first signal and a second signal; (b) a second means for generating as an output a third signal; and (c) a third means for adding delay to a propagation path of the first signal, said third means for adding being responsive to a first glitch on the third signal caused by the receiver sensing a first transition on the first signal before the receiver sensing a second transition on the second signal.

The present invention also provides a receiver for interpreting signals sent on a bi-directional, simultaneous transmission line, the receiver comprising (a) a first comparator configured to receive into its positive and negative inputs a three-state digital signal from the transmission line and a first reference voltage level, respectively, and generate a first two-state digital signal, the three-state digital signal having first, second, and third state voltage levels, respectively; (b) a second comparator configured to receive into its positive and negative inputs the three-state digital signal from the transmission line and a second reference voltage level, respectively, and generate a second two-state digital signal; and (c) a logic circuit configured to receive as inputs the first and second two-state digital signals and a third two-state digital signal and to generate as an output a fourth two-state digital signal as a function of the first, second, and third two-state digital signals, wherein the first reference voltage level is higher than the second reference voltage level, and the first, second, and third state voltage levels are above the first reference voltage level, between the first and second reference voltage levels, and below the second reference voltage level, respectively.

The present invention also provides a method for interpreting signals sent on a bi-directional, simultaneous transmission line, the method comprising the steps of (a) using a first comparator to receive into its positive and negative inputs a three-state digital signal from the transmission line and a first reference voltage level, respectively, and generate a first two-state digital signal, the three-state digital signal having first, second, and third state voltage levels, respectively; (b) using a second comparator to receive into its positive and negative inputs the three-state digital signal from the transmission line and a second reference voltage level, respectively, and to generate a second two-state digital signal; and (c) using a logic circuit to receive as inputs the first and second two-state digital signals and a third two-state digital signal and generate as an output a fourth two-state digital signal as a function of the first, second, and third two-state digital signals, wherein the first reference voltage level is higher than the second reference voltage level, and the first, second, and third state voltage levels are above the first reference voltage level, between the first and second reference voltage levels, and below the second reference voltage level, respectively.

The present invention provides structures for a receiver that eliminates glitches at its output.

The present invention also provides methods for operating the receiver so that glitches at its output are eliminated.

BRIEF DESCRIPTION OF THE DRAWINGS

FIGS. 3B-1, 3B-2, and 3B-3 illustrate waveforms of different signals related to the glitch detector of FIG. 2 in three different situations.

DETAILED DESCRIPTION OF THE INVENTION

Figure 1:
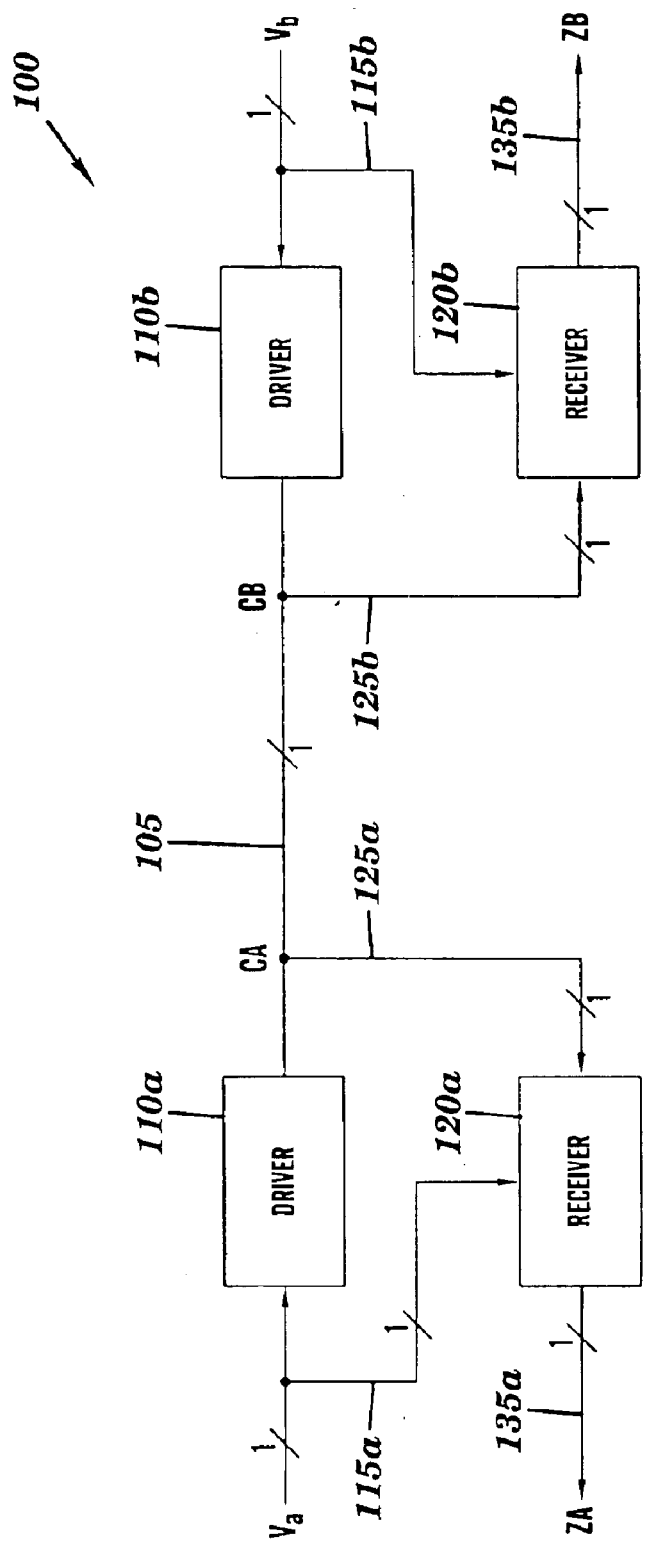
FIG. 1 illustrates a structure comprising a physical transmission line having a driver and a receiver at each of its two end, in accordance with embodiments of the present invention.

FIG. 1 illustrates a structure 100 comprising a transmission line having a driver and a receiver at each of its two ends, in accordance with embodiments of the present invention. More specifically, the structure 100 comprises drivers 110a and 110b whose outputs are electrically coupled together via a transmission line 105.

The structure 100 further comprises receivers 120a and 120b. The receiver 120a is electrically coupled to the input of the driver 110a and node CA of the transmission line 105 via connections 115a and 125a, respectively. The receiver 120a monitors both the digital signal on the input of the driver 110a (Va) and the voltage level on node CA of the transmission line 105 ($V_{CA}$) and generates a digital output signal ZA on connection 135a.

Similarly, the receiver 120b is electrically coupled to the input of the driver 110b and node CB of the transmission line 105 via connections 115b and 125b, respectively. The receiver 120b monitors both the digital signal on the input of the driver 110b (Vb) and the voltage level on node CB of the transmission line 105 ($V_{CB}$) and generates a digital output signal ZB on connection 135b.

In one embodiment, when Va=Vb=1, then $V_{CA}=V_{CB}=$Vcc. When Va=Vb=0, then $V_{CA}=V_{CB}=$0V. When Va=1 and Vb=0, or when Va=0 and Vb=1, then $V_{CA}=V_{CB}=$½VCC. As a result, by sensing both Va and $V_{CA}$, the receiver 120a can determine the digital value of Vb and generates that digital value as ZA. Similarly, by sensing both Vb and $V_{CB}$, the receiver 120b can determine the digital value of Va and generates that digital value as ZB. As a result, the driver 110a can send a digital value of Va to the receiver 120b and the driver 110b can send a digital value of Vb to the receiver 120a simultaneously via the transmission line 105.

As an example of the operation of the structure 100 in accordance with embodiments of the present invention, assume that Va=0 and Vb=1. As a result, $V_{CA}=V_{CB}=$½Vcc. These values of Va, Vb, $V_{CA}$ and $V_{CB}$ mean that the driver 110a is sending a logic 0 to the receiver 120b and the driver 10b is sending a logic 1 to the receiver 120a simultaneously via the transmission line 105. As a result, the receiver 120b outputs a logic signal ZB=0 and the receiver 120a outputs a logic signal ZA=1 to reflect what the drivers 110a and 110b are sending, respectively.

At a later time, assume that Va changes from 0 to 1. In response, both $V_{CA}$ and $V_{CB}$ change from ½Vcc to Vcc. After the transitions, Va=Vb=1 and $V_{CA}=V_{CB}=$Vcc. These values mean that the driver 110a is sending a logic 1 to the receiver 120b and the driver 110b is sending a logic 1 to the receiver 120a simultaneously via the transmission line 105. As a result, the receiver 120a outputs a logic signal ZA=1 and the receiver 120b outputs a logic signal ZB=1 to reflect what the drivers 110a and 110b are sending, respectively.

In one embodiment, while Vb=1, the receiver 120a senses the change of Va from 0 to 1 (rising transition) and the resulting change of $V_{CA}$ from ½Vcc to Vcc at the same time. As a result, ZA=1 before, during, and after the changes of Va and $V_{CA}$. In other words, there is no glitch at the digital output signal ZA of the receiver 120a, and ZA correctly reflects the digital value of Vb regardless of such changes of Va and $V_{CA}$.

Figure 2:
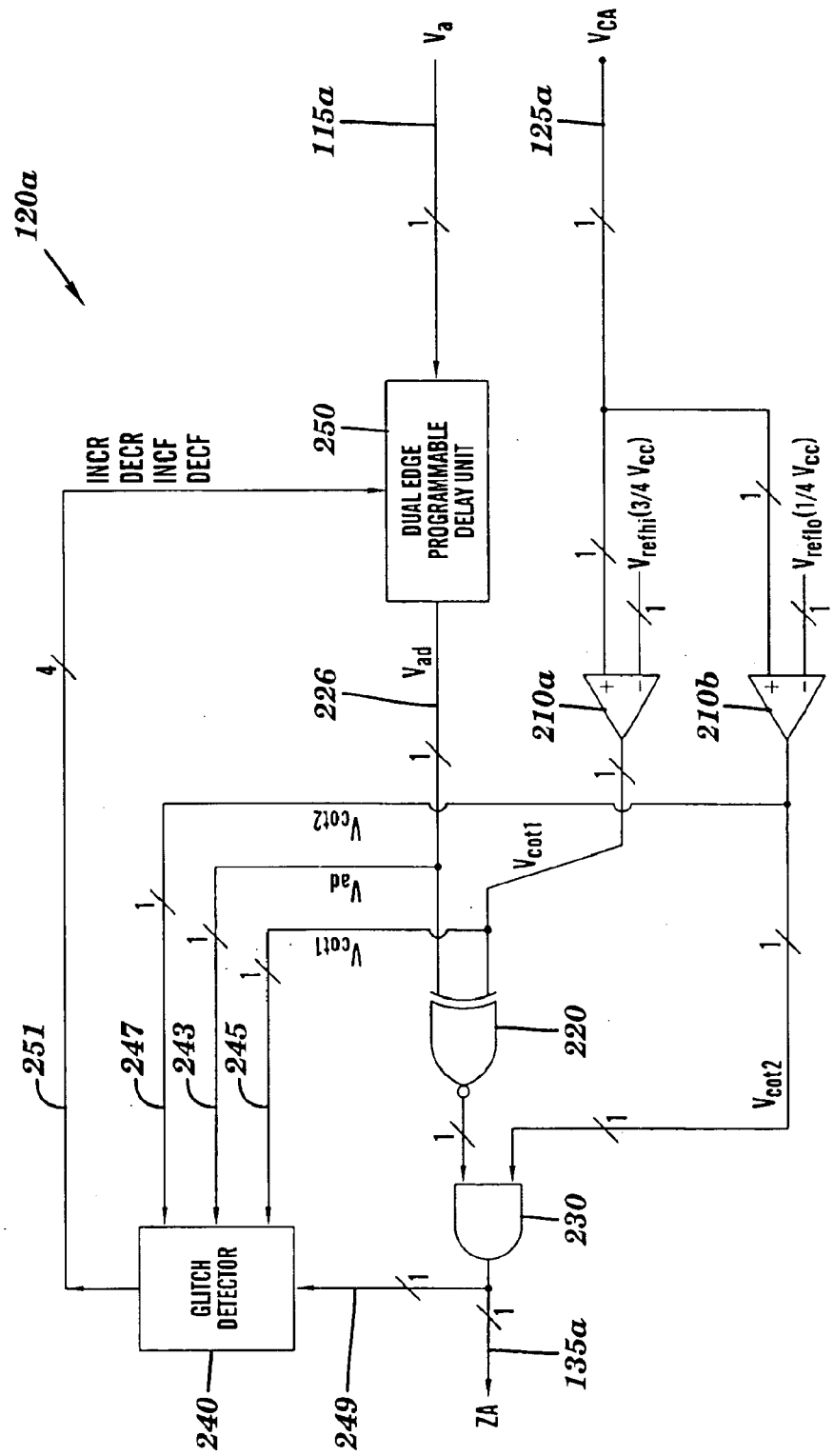
FIG. 2 illustrates one of the two receivers of FIG. 1, the receiver comprising a glitch detector and a dual edge programmable delay unit, in accordance with embodiments of the present invention.

FIG. 2 illustrates the receiver 120a of FIG. 1, in accordance with embodiments of the present invention. Illustratively, the receiver 120a comprises two comparators 210a and 210b, an exclusive-NOR gate 220, and the AND gate 230, a glitch detector 240, and a dual edge programmable delay unit 250.

The comparator 210a receives $V_{CA}$ and Vrefhi as its positive and negative inputs, respectively, and generates a digital signal Vcot1 to the exclusive-NOR gate 220. In general, if the voltage level of the positive input of a comparator is higher than that of the negative input, the comparator generates a logic 1. Otherwise, the comparator generates a logic 0. Here, when $V_{CA}$>Vrefhi, then Vcot1=1. When $V_{CA}$<Vrefhi, then Vcot1=0.

The comparator 210b receives $V_{CA}$ and Vreflo as its positive and negative inputs, respectively, and generates a digital signal Vcot2 to the AND gate 230. When $V_{CA}$>Vreflo, then Vcot2=1. When $V_{CA}$<Vreflo, then Vcot2=0.

The dual edge programmable delay unit 250 receives Va as an input and generates a delayed signal Vad of Va to the exclusive-NOR gate 220 and the glitch detector 240. The delay times of the rising edge and falling edge of Va can be set independently according to the output signals from the glitch detector 240. The exclusive-NOR gate 220 receives Vad and Vcot1 as two inputs and generates a digital output signal to the AND gate 230.

The AND gate 230 receives Vcot2 and the output from the exclusive-NOR gate 220 as two inputs and generates ZA to the glitch detector 240. The glitch detector 240 receives ZA, Vad, Vcot1, and Vcot2 as inputs and generates four output signals INCR, DECR, INCF, DECF to the dual edge programmable delay unit 250 via connection 251.

In one embodiment, Vrefhi and Vreflo are chosen to be ¾Vcc and ¼Vcc, respectively. As a result, when $V_{CA}$ has the values 0V, ½Vcc, and Vcc, then Vcot1 has the resulting values of 0, 0, and 1, respectively, and Vcot2 has the resulting values of 0, 1, and 1, respectively. In other words, the two comparators 210a and 210b convert the three voltage levels 0V, ½Vcc, and Vcc of $V_{CA}$, representing three digital states of $V_{CA}$, into the output digital values of Vcot1 and Vcot2.

In the example described above, initially, Va=0, Vb=1, and $V_{CA}$=½Vcc. Because $V_{CA}$>Vreflo =>Vcot2=1. As a result, the AND gate 230 is transparent with respect to the exclusive-NOR gate 220. As a result, ZA depends only on the values of Vad and Vcot1. Therefore, ZA=1 only if Vad=Vcot1, digitally; and ZA=0 otherwise. On one hand, Vad=Va=0. On the other hand, Vcot1=0 because $V_{CA}$<Vrefhi (½Vcc<¾Vcc). Therefore, Vad=Vcot1, and as a result, ZA=1, which is the correct logic value of Vb being sent the driver 110b (FIG. 1) to the receiver 120a via the transmission line 105 (FIG. 1).

When Va starts changing from 0 to 1, in response, with some delay caused by the driver 110a (FIG. 1), $V_{CA}$ starts changing from ½Vcc to Vcc. As a result of the changes of Va and $V_{CA}$, both Vad and Vcot1 change from 0 to 1. During the transition, $V_{CA}$>Vreflo, therefore, Vcot2=1. As a result, the AND gate 230 is transparent with respect to the exclusive-NOR gate 220, and therefore ZA depends only on Vad and Vcot1. Because eventually Vad=Vcot1=1, therefore, eventually, ZA=1, which is the correct logic value of Vb being sent the driver 110b to the receiver 120a via the transmission line 105 (FIG. 1).

Assume that Vad changes from 0 to 1 before Vcot1 does. In other words, the change of Va from 0 to 1 reaches the exclusive-NOR gate 220 through the dual edge programmable delay unit 250 before the same change of Va reaches the exclusive-NOR gate 220 through the driver 110a (FIG. 1) and the comparator 210a. As a result, there is a time period during which Vad=1 and Vcot1=0, and therefore ZA=0, which is not the correct logic value the driver 110b (FIG. 1) is sending to the receiver 120a. Later, when Vcot1 also becomes 1, ZA changes back to 1, which is the correct logic value the driver 110b is sending to the receiver 120a. In other words, there is a negative glitch on ZA starting at the rising edge of Vad.

In one embodiment, the glitch in ZA triggers the glitch detector 240 via the connection 249. In response to the glitch on connection 249, and to the specific logic values of Vad, Vcot1, and Vcot2 on connections 243, 245, and 247, respectively, the glitch detector 240 generates a pulse on signal INCR that causes the dual edge programmable delay unit 250 to add more delay to the propagation path of the rising edge of signal Va. As a result, the next time Va changes from 0 to 1, it takes longer for that change of Va from 0 to 1 to pass the dual edge programmable delay unit 250.

Assume further that Va goes through a series of 0-to-1 (i.e., rising) transitions, causing a series of glitches similar to the one described above. As a result, the dual edge programmable delay unit 250 keeps adding more and more delay to the propagation path of the rising signal Va. At some point, in response to a change of Va from 0 to 1, Vad and Vcot1 change from 0 to 1 at the same time. As a result, glitch problem is eliminated for the case in which Vb=1, Va changes from 0 to 1, and initially Vad changes from 0 to 1 before Vcot1 does.

Assume, alternatively, that Vad changes from 0 to 1 after Vcot1 does. In other words, the change of Va from 0 to 1 reaches the exclusive-NOR gate 220 through the dual edge programmable delay unit 250 after the same change of Va reaches the exclusive-NOR gate 220 through the driver 110a (FIG. 1) and the comparator 210a. As a result, there is a time period during which Vad=0 and Vcot1=1, and therefore ZA=0, which is not the correct logic value the driver 110b (FIG. 1) is sending to the receiver 120a. Later, when Vad also becomes 1, ZA changes back to 1, which is the correct logic value the driver 110b is sending to the receiver 120a. In other words, there is a negative glitch in ZA starting at the rising edge of VcoltI.

In one embodiment, the glitch in ZA triggers the glitch detector 240 via the connection 249. In response to the glitch on the connection 249, and to the specific logic values of Vad, Vcot1, and Vcot2 on the connections 243, 245, and 247, respectively, the glitch detector 240 generates a pulse on signal DECR that causes the dual edge programmable delay unit 250 to subtract delay from the propagation path of the rising signal Va. As a result, the next time Va rises from 0 to 1, it takes less time for that change of Va from 0 to 1 to pass the dual edge programmable delay unit 250.

Assume further that Va goes through a series of 0-to-1 transitions, causing a series of glitches similar to the one described above. As a result, the dual edge programmable delay unit 250 keeps subtracting more and more delay from the propagation path of the rising signal Va. At some point, in response to a change of Va from 0 to 1, Vad and Vcot1 change from 0 to 1 at the same time. As a result, glitch problem is eliminated for the case in which Vb=1, Va changes from 0 to 1, and initially Vad changes from 0 to 1 after Vcot1 does.

Similarly, when Va changes from 1 to 0 (i.e., falling transition) while Vb=1, in response, both Vad and Vcot1 change from 1 to 0, but not necessarily at the same time.

If Vad changes from 1 to 0 before Vcot1 does, the resulting glitch on ZA causes the glitch detector 240 to generate a pulse on signal INCF that in turn causes the dual edge programmable delay unit 250 to add more delay to the propagation path of the falling signal Va. As a result, the next time Va falls from 1 to 0, it takes longer for that change of Va from 1 to 0 to pass the dual edge programmable delay unit 250.

Assume further that Va goes through a series of 1-to-0 (falling) transitions, causing a series of glitches similar to the one described above. As a result, the dual edge programmable delay unit 250 keeps adding more and more delay to the propagation path of the falling signal Va. At some point, in response to a change of Va from 1 to 0, Vad and Vcot1 change from 1 to 0 at the same time. As a result, glitch problem is eliminated for the case in which Vb=1, Va changes from 1 to 0, and initially Vad changes from 1 to 0 before Vcot1 does.

Similarly, if Vad changes from 1 to 0 after Vcot1 does, the resulting glitch on ZA causes the glitch detector 240 to generate a pulse on signal DECF that in turn causes the dual edge programmable delay unit 250 to subtract delay from the propagation path of the falling signal Va. As a result, the next time Va falls from 1 to 0, it takes shorter for that change of Va from 1 to 0 to pass the dual edge programmable delay unit 250.

Assume further that Va goes through a series of 1-to-0 transitions, causing a series of glitches similar to the one described above. As a result, the dual edge programmable delay unit 250 keeps subtracting more and more delay from the propagation path of the falling signal Va. At some point, in response to a change of Va from 1 to 0, Vad and Vcot1 change from 1 to 0 at the same time. As a result, glitch problem is eliminated for the case in which Vb=1, Va changes from 1 to 0, and initially Vad changes from 1 to 0 after Vcot1 does.

The description above can be summarized as follows. If a glitch occurs at the rising edge of Vad, Va rising edge needs more delay. If a glitch occurs at the rising edge of Vcot1, Va rising edge needs less delay. If a glitch occurs at the falling edge of Vad, Va falling edge needs more delay. If a glitch occurs at the falling edge of Vcot1, Va falling edge needs less delay.

In summary, during initialization of the structure 100, by holding Vb=1 (Vcc) and changing Va back and forth between logic 0 and 1 (i.e., 0V and Vcc, respectively) for a certain number of times, the dual edge programmable delay unit 250 can be programmed to cause the changes of Vad and Vcot1 (both changes caused by a change of Va) to occur at the same time at the inputs of the exclusive-NOR gate 220. As a result, the glitch problem is eliminated after initialization.

Figure 3A:
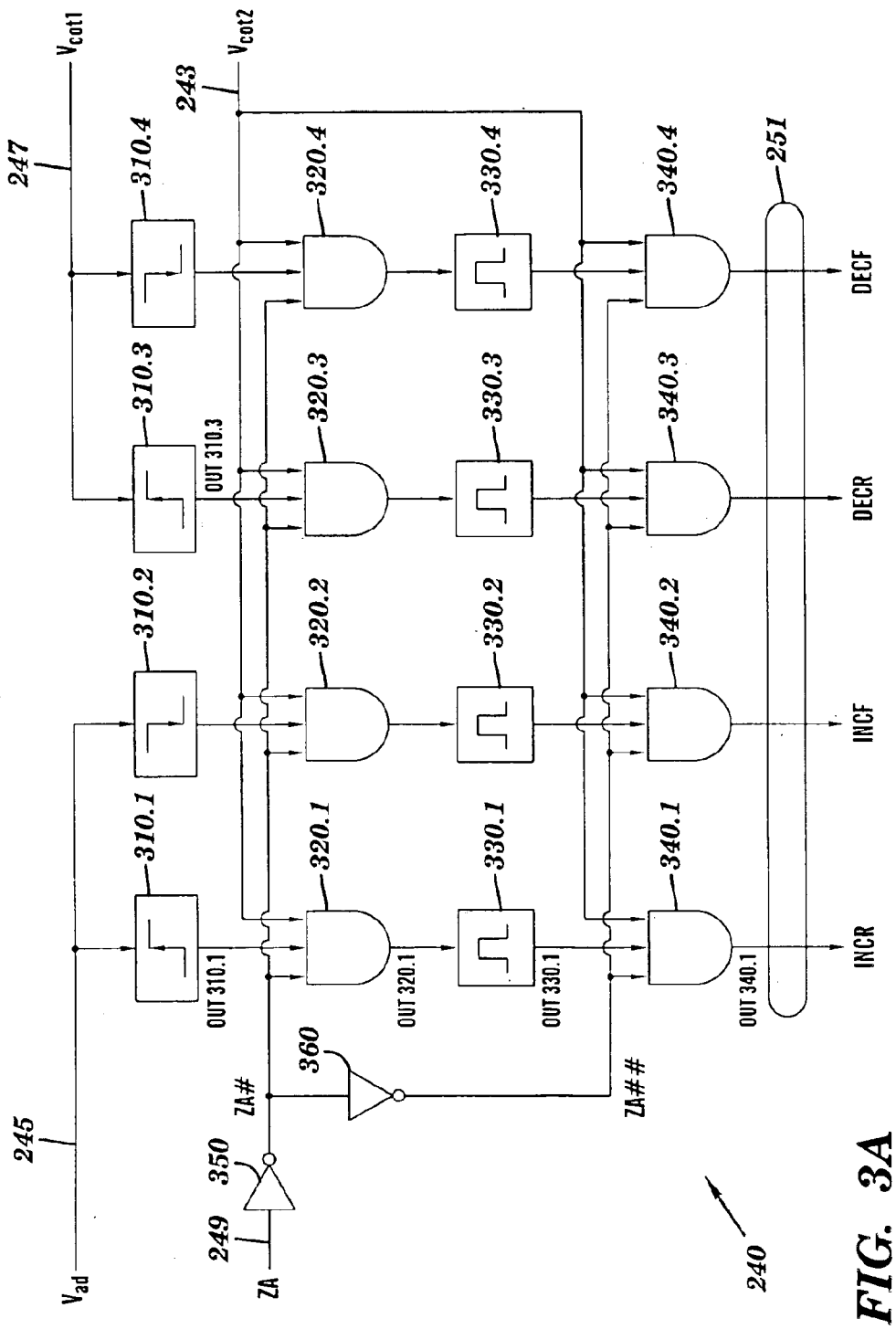
FIG. 3A illustrates the glitch detector of FIG. 2, in accordance with embodiments of the present invention.

During normal operation, the glitch problem may occur due to the delay time of electronic components varying when temperature and power supply voltage change, the glitch problem can be eliminated in a similar way mentioned above in real time. FIG. 3A illustrates the glitch detector 240 of FIG. 2, in accordance with embodiments of the present invention. Illustratively, the glitch detector 240 comprises four pulse generators 310.1, 310.2, 310.3, and 310.4, eight AND gates 320.1, 320.2, 320.3, 320.4, 340.1, 340.2, 340.3, and 340.4, four pulse delay circuits 330.1, 330.2, 330.3, and 330.4, and two inverters 350 and 360. In one embodiment, the pulse generators 310.1 and 310.3 are rising edge triggered one-shot pulse generators; and the pulse generators 310.2 and 310.4 are falling edge triggered one-shot pulse generators. The pulse generators 310.1, 310.2, 310.3, and 310.4 are configured to generate one positive pulse with the pulse width of one quart of the bit length of the system 100 when they are triggered. Each of the pulse delay circuits 330.1, 330.2, 330.3, and 330.4 can delay its input pulse to its output pulse by half of the bit length of the system 100.

In one embodiment, the functions of the glitch detector are (i) to detect a glitch which is any negative pulse on ZA having a pulse width being less than half of the bit length of the system, and (ii) to determine the cause of the glitch according to when the glitch occurs so that a positive pulse on one of the delay time adjustment signals INCR, INCF, DECR, and DECF is generated and sent to the dual edge programmable delay unit 250.

Usually digital circuits always have the input threshold voltage of ½ Vcc. In one embodiment, the inverter 350 has the threshold voltage of ¾% Vcc instead, therefore when the negative glitch voltage on ZA drops to ¼Vcc, which has not triggered any digital circuits receiving ZA as an input (not shown), the inverter 350 is triggered and the delay time adjustment procedure starts before the glitch affect the circuits connecting to ZA.

If Vb=0, then Vcot2=0. As a result, the AND gates of 320.1, 320.2, 320.3, 320.4, 340.1, 340.2, 340.3, and 340.4 prevent any positive pulse from passing them. Therefore, no positive pulse is generated on INCR, INCF, DECR, and DECF.

If Vad or Vcot1 have a logic transition, a positive pulse is generated by the corresponding one-shot pulse generator. There are three possible situations. Situation #1: if the logic status of ZA is always at logic high, there is no glitch on ZA. As a result, ZA# is at logic low. Therefore, the AND gates 320.1, 320.2, 320.3 and 320.4 prevent any positive pulse (if any) from passing. In other words, the positive pulses generated by 310.1, 310.2, 310.3, 310.4 at the rising edges or falling edges of Vad and Vcot1 are blocked by AZ# in 320.1, 320.2, 320.3 and 320.4 respectively, no positive pulse is generated on INCR, INCF, DECR, and DECF.

Situation #2: if a normal negative pulse occurs on ZA (caused by Vb changing from 1 to 0 while Va=1, for instance), its pulse width must be greater than one bit length of the system. As a result, ZA## is at logic low long enough to block any positive pulse from the one-shot generators 310. Therefore, no positive pulse is generated on INCR, INCF, DECR, and DECF.

Situation #3: if a negative glitch occurs on ZA, the pulse width of the glitch is less than ½ of the bit length. As a result, ZA## cannot block any positive pulse from the one-shot pulse generators 310. Therefore, one positive pulse is generated on one of INCR, INCF, DECR, and DECF.

Figures 1, 3B:
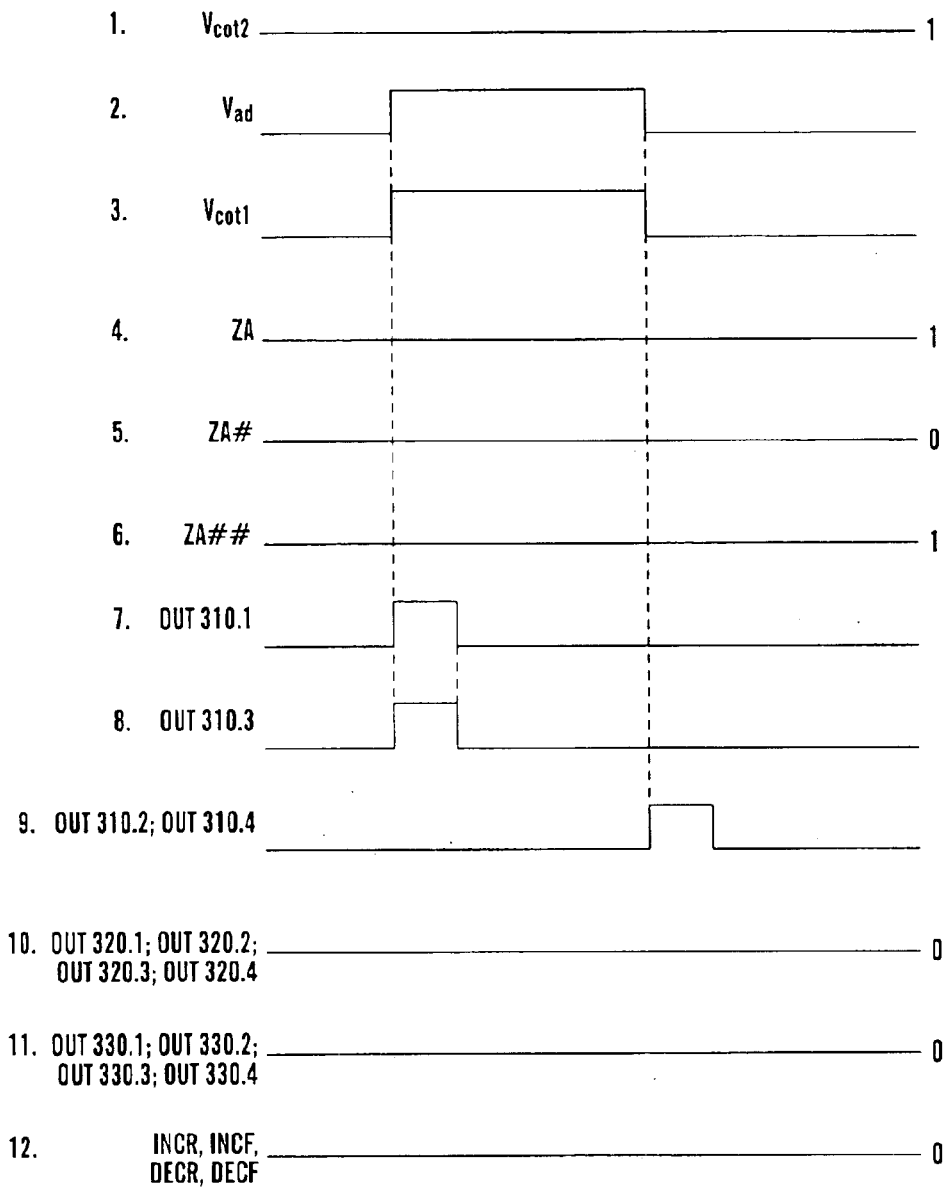
Figures 2, 3B:
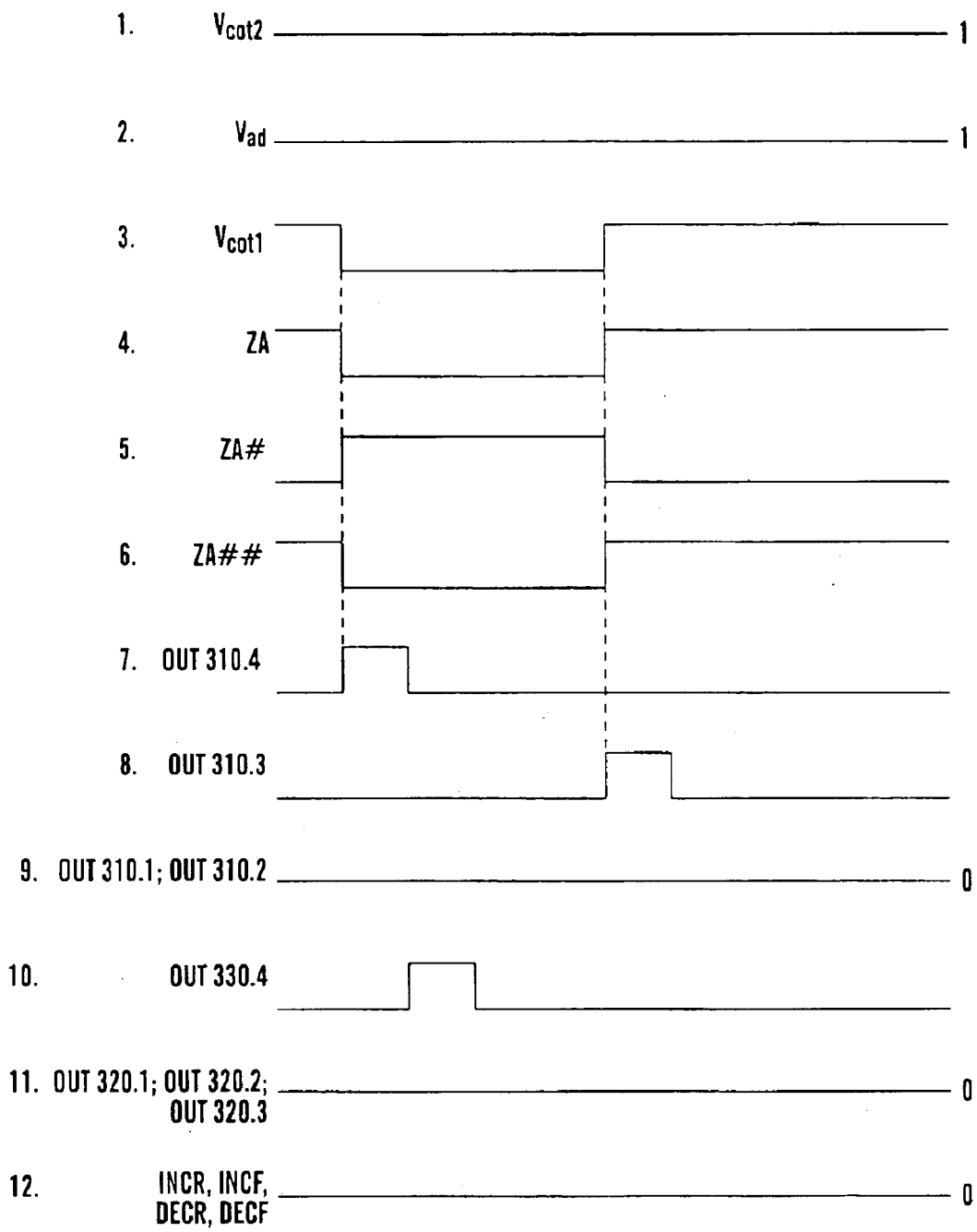

The waveforms shown in FIG. 3B-1 are for Situation #1 mentioned above. Vcot2 remains at logic 1 shown at waveform 1, Vad and Vcot1 have the rising edges and falling edges at the same time which are shown at waveforms 2, 3 respectively. AZ shown in waveform 4 is always at logic 1 while ZA# and ZA## are at logic 0 and logic 1, respectively, which are shown in waveforms 5 and 6. The positive pulses generated by pulse generators 310.1 and 310.3 are shown in waveforms 7 and 8, respectively. Also, the positive pulses generated by pulse generators 310.2 and 310.4 are shown in waveform 9 (they are coincide). But all these positive pulses generated by the pulse generators 310.1, 310.2, 310.3, and 310.4 are blocked by ZA# of logic 0 at the AND gates 320.1, 320.2, 320.3, and 320.4 respectively. Therefore no positive pulse is generated on INCR, INCF, DECR or DECF.

The waveforms shown in FIG. 3B-2 are for Situation #2 mentioned above. In this situation, Va is at logic 1, Vb changes from logic 1 to logic 0 and then back to logic 1 with one bit length so that both of Vcot2 and Vad remain at logic 1. As a result, Vcot1 and ZA have the negative pulses with the pulse widths of one bit length, which are the normal pulses, not a glitch. When 310.4 generates a positive pulse at the falling edge of Vcot1, ZA# is at logic 1, and the pulse on signal OUT310.4 shown in waveform 7 of FIG. 3B-2 passes the AND gate 320.4 and triggers the pulse delay circuit 330.4 to generate the delayed pulse on signal OUT330.4 as shown in waveform 10. However, the pulse of waveform 10 is blocked by ZA## of logic 0 in the AND gate 340.4. The pulse generated by the pulse generator 310.3 at Vcolt1 rising time which is shown in waveform 8 is blocked by ZA# at logic 0 in AND gate 320.3. Therefore no positive pulse is generated on INCR, INCF, DECR or DECF.

Figures 3, 3B:
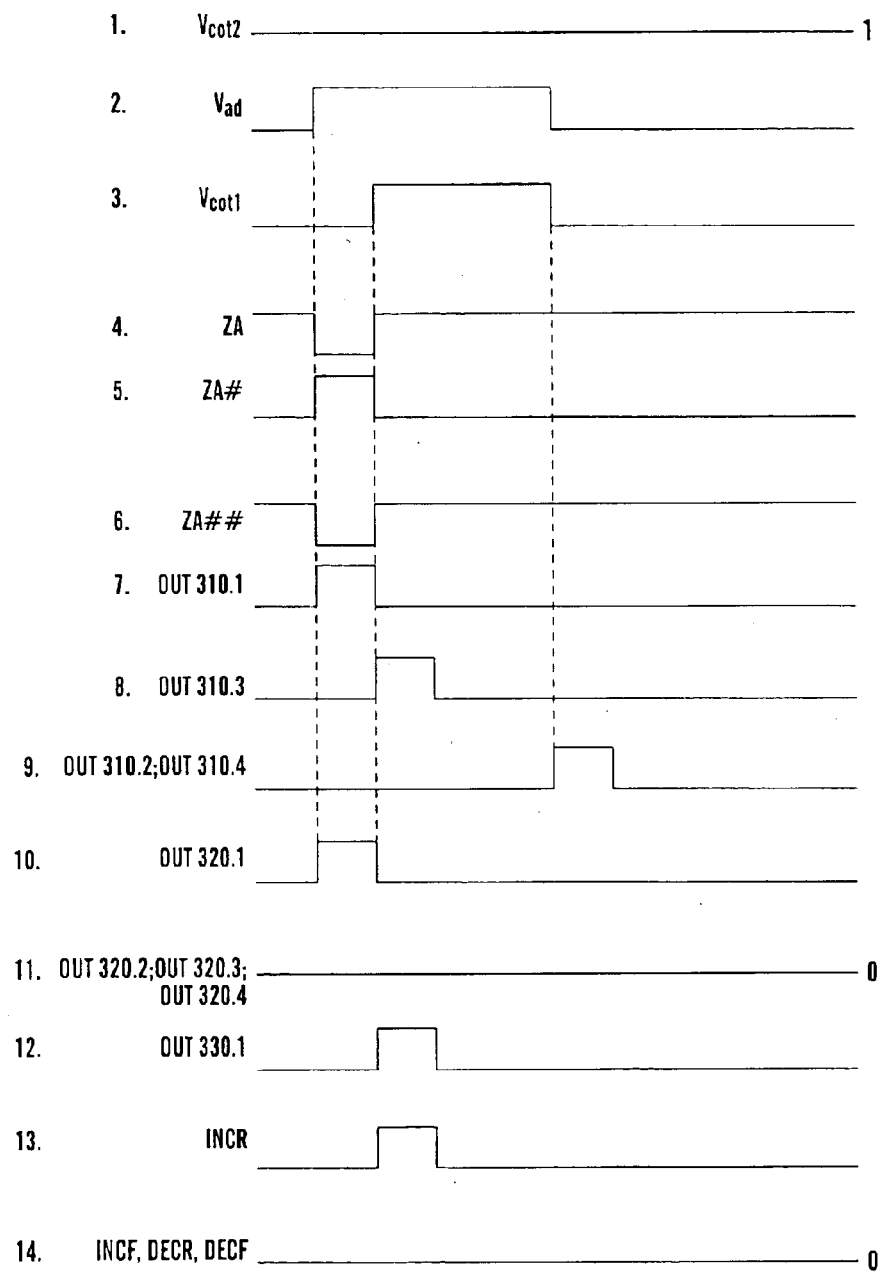

The waveforms shown in FIG. 3B-3 are for Situation #3 mentioned above. In this situation, a glitch is created on ZA due to the rising edge of Vad occurring before the rising edge of Vcot1 ¼ bit length. The negative glitch shown in waveform 4. The pulse generator 310.1 generates a positive pulse at the rising edge of Vad when ZA is at logic 0 and ZA# is at logic 1, so that the pulse can pass the AND gate 320.1 to trigger the pulse delay circuit 330.1 to generate a delayed pulse on signal OUT330.1 as shown in waveform 12. When the delayed pulse is generated, ZA## is at logic 1, and therefore it can pass the AND gate 340.1 to become a positive pulse on INCR, as shown in waveform 13. The pulse generated by 310.3 at the rising edge of Vcot1 when ZA# is at logic 0 (see waveforms 5 and 8) is blocked by ZA#=0 in the AND gate 320.3. The pulses generated by the pulse generators 310.2 and 310.4 at the falling edges of Vad and Vcot1 when ZA# is at logic 0 are blocked by ZA#=0 in the AND gates 320.2 and 320.4, respectively. Therefore only a pulse is on INCR to increase the delay time of Vad.

Figure 4:
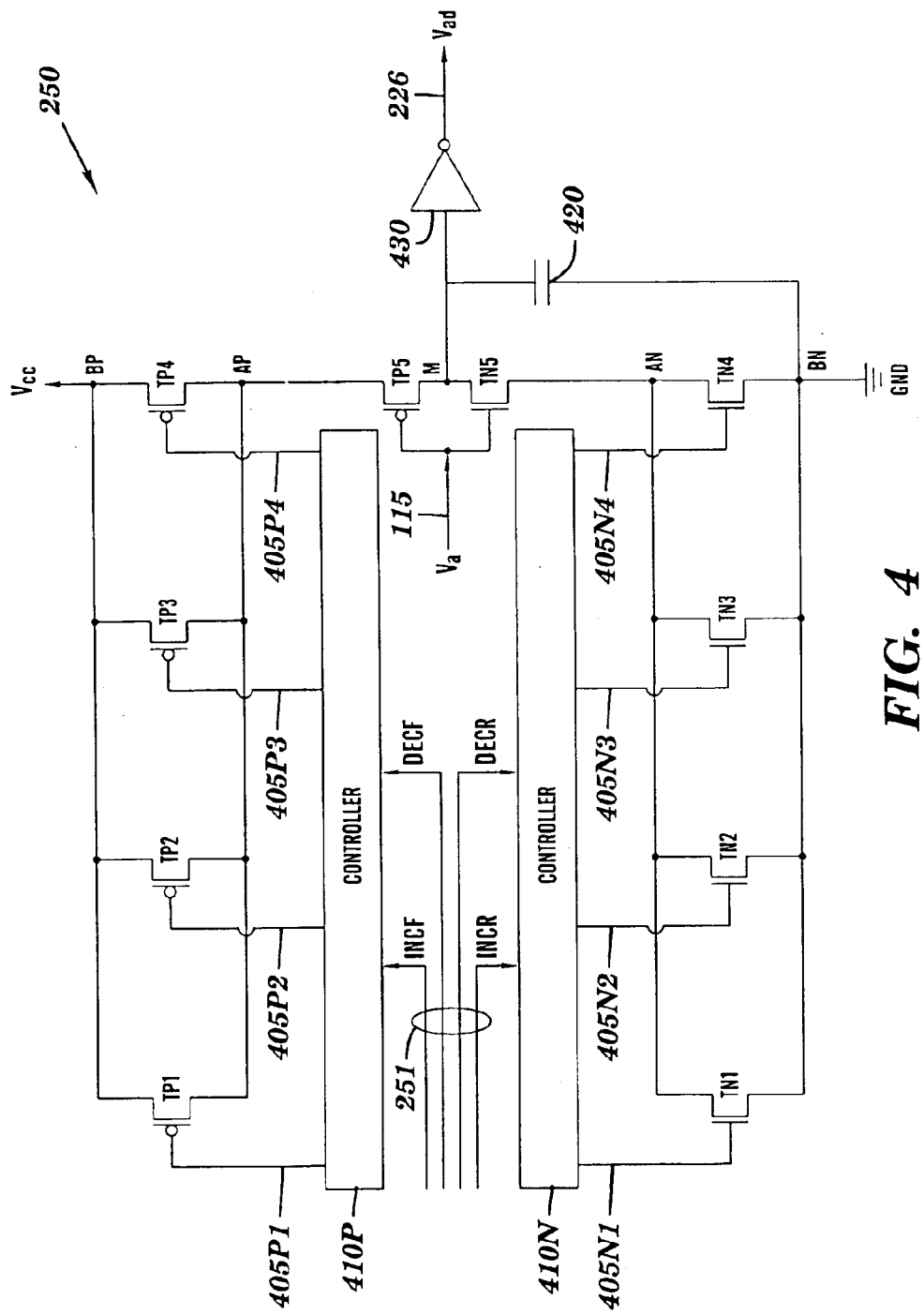
FIG. 4 illustrates the dual edge programmable delay unit of FIG. 2, in accordance with embodiments of the present invention.

FIG. 4 illustrates the dual edge programmable delay unit 250 of FIG. 2, in accordance with embodiments of the present invention. Illustratively, the dual edge programmable delay unit 250 comprises five P-channel transistors TP1, TP2, TP3, TP4, and TP5, five N-channel transistors TN1, TN2, TN3, TN4, and TN5, two controllers 410P and 410N, an inverter 430, and a capacitor 420.

The four transistors TP1, TP2, TP3, and TP4 are electrically connected in parallel between two nodes AP and BP and their gates are electrically connected to the controller 410P. The controller 410P receives the signals INCF and DECF from the glitch detector 240 via connection 251.

Similarly, the four transistors TN1, TN2, TN3, and TN4 are electrically connected in parallel between two nodes AN and BN and their gates are electrically connected to the controller 410N. The controller 410N receives the signals INCR and DECR from the glitch detector 240 via connection 251.

Transistors TP5 and TN5 are electrically connected in series between node AP and node AN. Their common node M is electrically connected to the input of the inverter 430 whose output signal is Vad. Their gates receive signal Va. The capacitor 420 is electrically coupled between node M and node BN.

In the example above, for the case in which Vad changes from 0 to 1 before Vcot1 does, a positive pulse on INCR is generated as described above. Assume that all four transistors TN1, TN2, TN3, and TN4 are ON (electrically conducting). In one embodiment, the positive pulse on INCR causes the controller 410N to turn off, illustratively, transistor TN1 by pulling the gate of transistor TN1 from 1 down to 0. As a result, the next time Va changes from 0 to 1, transistor TN5 switches from OFF to ON and the charge stored in the capacitor 420 discharges through transistor TN5 and through the three electrically conducting transistors TN2, TN3, and TN4 in parallel. This discharging of the capacitor 420 takes longer than the previous time, when there were four electrically conducting transistors TN 1, TN2, TN3, and TN4 in parallel. As a result, it takes longer for Va to change from 0 to 1 than before. In other words, there is more delay between Va and Vad.

Assume that the resulting delay to Va is not sufficient and, as a result, in response to a next change of Va from 0 to 1, Vad changes from 0 to 1 before Vcot1 does, a second positive pulse on INCR is generated in a similar manner described above. The second positive pulse on INCR causes the controller 41 ON to turn off, illustratively, transistor TN2 by pulling the gate of transistor TN2 from 1 down to 0. As a result, the next time Va changes from 0 to 1, transistor TN5 switches from OFF to ON and the charge stored in the capacitor 420 discharges through transistor TN5 and through the two electrically conducting transistors TN3 and TN4 in parallel. This discharging of the capacitor 420 takes longer than the previous time, when there were three electrically conducting transistors TN2, TN3, and TN4 in parallel. As a result, it takes longer for Va to change from 0 to 1 than before. In other words, there is even more delay between Va and Vad. If Va goes through a series of 0-to-1 transitions, at some point, in response to a change of Va from 0 to 1, both Vad and Vcot1 change from 0 to 1 at the same time. As a result, there is no glitch on ZA and no positive pulse on INCR, and the dual edge programmable delay unit 250 stops adjusting delay for Va.

The dual edge programmable delay unit 250 operates in a similar manner for case in which Vad changes from 0 to 1 after Vcot1 does. Here, a positive pulse on DECR is generated as described above. The positive pulse on DECR causes the controller 410N to turn on one more transistor TN so that the next time Va changes from 0 to 1, the capacitor 430 will have one more TN transistor through which to discharge its stored charge. As a result, it takes less time for Va to change from 0 to 1 than before. In other words, there is less delay between Va and Vad for later rising Va transitions.

The dual edge programmable delay unit 250 operates in a similar manner for case in which Vad changes from 1 to 0 before Vcot1 does. Here, a positive pulse on INCF is generated as described above. The positive pulse on INCF causes the controller 410P to turn off one more transistor TP so that the next time Va changes from 1 to 0, the capacitor 430 will have one less TP transistor in parallel through which to recharge itself. As a result, it takes more time than before for Va to change from 1 to 0. In other words, there is more delay between Va and Vad for later falling Va transitions.

The dual edge programmable delay unit 250 operates in a similar manner for case in which Vad changes from 1 to 0 after Vcot1 does. Here, a positive pulse on DECF is generated as described above. The positive pulse on DECF causes the controller 410P to turn on one more transistor TP in parallel so that the next time Va changes from 1 to 0, the capacitor 430 will have one more TP transistor in parallel through which to recharge itself. As a result, it takes less time than before is for Va to change from 1 to 0. In other words, there is less delay between Va and Vad for later falling Va transitions.

In summary, for Vb=1 and Va switching back and forth between 0 and 1, the dual edge programmable delay unit 250 automatically adjusts the delay of Va so that in response to later Va transitions, both Vad and Vcot1 change at the same time. As a result, the glitch problem on ZA is eliminated for the case Vb=1.

With reference back to FIG. 2, assume that Va=0 and Vb=1. As a result, $V_{CA}$=½VCC and ZA=1. Assume further that Vb changes from 1 to 0. This change causes $V_{CA}$ to change from ½Vcc to 0V causing Vcot2 to change from 1 to 0. Vcot2 changing from 1 to 0 causes the AND gate 230 to change ZA from 1 to 0, which correctly reflects the logic value of Vb. With reference to FIG. 3, the change of ZA from 1 to 0 does not cause the glitch detector 240 to generate any positive pulse on INCR, DECR, INCF, and DECF. The reason is that Vcot2 changing from 1 to 0 causes the AND gates 340 to generate 0 all the time. Any positive pulse generated, if any, passing the delay circuits 330 will see that Vcot2 has been switched to 0. As a result, there is no adjustment to delay for Va.

With reference back to FIG. 2, assume that Va=1 and Vb=1. As a result, $V_{CA}$=Vcc and ZA=1. Assume further that Vb changes from 1 to 0. This change causes $V_{CA}$ to change from Vcc to ½VCC causing Vcot1 to change from 1 to 0. Vcot1 changing from 1 to 0 causes the output of the exclusive-NOR to change from 1 to 0 causing the AND gate 230 to change ZA from 1 to 0, which correctly reflects the logic value of Vb. With reference to FIG. 3, the change of ZA from 1 to 0 does not cause the glitch detector 240 to generate any positive pulse on INCR, DECR, INCF, and DECF. The reason is that ZA changing from 1 to 0 causes ZA## to change from 1 to 0 causing the AND gates 340 to generate 0 all the time. Due to the delay caused by the delay circuits 330, by the time any pulse generated by the pulse generators 310 reaches the AND gates 340, ZA## has been switched from 1 to 0 preventing the AND gates 340 from passing the pulse to INCR, DECR, INCF, and DECF. As a result, there is no adjustment to delay for Va in this case.

In one embodiment, the comparators 210a and 210b (FIG. 2) are identical. Assume that the glitch problem on ZA has been eliminated in the system 100 (FIG. 1) for the case in which Vb=1 and Va switching back and forth between 0 and 1. As a result, the delay along the signal propagation path from node Va (the input of the driver 110a) to the exclusive-NOR gate 220 via the dual edge programmable delay unit 250 and the delay along the signal propagation path from node Va to the exclusive-NOR gate 220 via the driver 110a (FIG. 1) and the comparator 210a are the same. Because the delay associated with the exclusive-NOR gate 220 is negligible and because the comparators 210a and 210b are identical, starting from the same start point of node Va and ending at the same destination point of the AND gate 230, there are three different paths that have the same delay. The first path goes through the dual edge programmable delay unit 250 and the exclusive-NOR gate 220. The second path goes through the driver 110a (FIG. 1) and the comparator 210a. The third path goes through the driver 110a (FIG. 1) and the comparator 210b. As a result of the first, second, and third paths having the same signal propagation delay, the glitch problem on ZA is also eliminated in the system 100 (FIG. 1) for the case in which Vb=0 and Va switching back and forth between 0 and 1.

In the embodiments described above, there are two comparators 210a and 210b in FIG. 2. In general, more than two comparators may be used to convert the three-state digital signal $V_{CA}$ (the three digital states correspond to three state voltage levels 0V, ½Vcc, and Vcc of $V_{CA}$) into two-state digital signals so that the logic circuit 220, 230 comprising the exclusive-NOR gate 220 and the AND gate 230 can understand.

In the embodiments described above, the dual edge programmable delay unit 250 has four transistors TN in parallel between nodes AN and BN (FIG. 4). In general, any number of transistors TN can be used in parallel between nodes AN and BN. Similarly, any number of transistors TP can be used in parallel between nodes AP and BP.

In the embodiments described above, the inverter 350 (FIG. 3A) and the inverter 430 (FIG. 4) can be of schmitt-trigger type that has a predefined threshold input voltage. If the input signal crosses the predefined threshold input voltage, the inverters switch state.

In the embodiments described above, the delay times for the rising edge and falling edge of Va are adjusted independently. The glitches are eliminated in real time and on line. The use of two comparators 210a and 210b (dual-voltage comparators) helps avoid the problems associated with the prior art use of only one comparator with threshold switching.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. A receiver, comprising:
   a first means for receiving as inputs a first signal and a second signal;
   a second means for generating as an output a third signal; and
   a third means for adding delay to a propagation path of the first signal, said third means for adding being responsive to a first glitch on the third signal caused by the receiver sensing a first transition on the first signal before the receiver sensing a second transition on the second signal.

2. The receiver of claim 1, wherein the first transition is a rising transition and the delay affects only rising transitions of the first signal.

3. The receiver of claim 1, wherein the first transition is a falling transition and the delay affects only falling transitions of the first signal.

4. The receiver of claim 1, further comprising a fourth means for subtracting delay from a propagation path of the first signal, said fourth means being responsive to a second glitch on the third signal caused by the receiver sensing a third transition on the first signal after the receiver sensing a fourth transition on the second signal.

5. The receiver of claim 4, wherein the third transition is a rising transition and the delay affects only rising transitions of the first signal.

6. The receiver of claim 4, wherein the third transition is a falling transition and the delay affects only falling transitions of the first signal.

7. A receiver for interpreting signals sent on a bi-directional, simultaneous transmission line, the receiver comprising:
   a first comparator configured to receive into its positive and negative inputs a three-state digital signal from the transmission line and a first reference voltage level, respectively, and generate a first two-state digital signal, the three-state digital signal having first, second, and third state voltage levels, respectively;
   a second comparator configured to receive into its positive and negative inputs the three-state digital signal from the transmission line and a second reference voltage level, respectively, and generate a second two-state digital signal; and
   a logic circuit configured to receive as inputs the first and second two-state digital signals and a third two-state digital signal and to generate as an output a fourth two-state digital signal as a function of the first, second, and third two-state digital signals, wherein
   the first reference voltage level is higher than the second reference voltage level, and
   the first, second, and third state voltage levels are above the first reference voltage level, between the first and second reference voltage levels, and below the second reference voltage level, respectively.

8. The receiver of claim 7, further comprising:
   a glitch detector electrically coupled to the logic circuit; and
   a programmable delay unit electrically coupled to the glitch detector, wherein in response to a glitch on the fourth two-state digital signal, the glitch detector is configured to cause the programmable delay unit to adjust delay to a propagation path of the third two-state digital signal.

9. The receiver of claim 8, wherein the glitch detector is further configured to receive as inputs the first, second, third, and fourth two-state digital signals and generate as an output a fifth control signal to the programmable delay unit, wherein the fifth control signal controls the adding of delay by the programmable delay unit to the propagation path of only rising transitions of the third two-state signal.

10. The receiver of claim 8, wherein the glitch detector is further configured to generate as an output a sixth control signal to the programmable delay unit, wherein the sixth control signal controls the adding of delay by the programmable delay unit to the propagation path of only falling transitions of the third two-state signal.

11. The receiver of claim 8, wherein the glitch detector is further configured to generate as an output a seventh control signal to the programmable delay unit, wherein the seventh control signal controls the subtracting of delay by the programmable delay unit from the propagation path of only rising transitions of the third two-state signal.

12. The receiver of claim 8, wherein the programmable delay unit comprises:
   a capacitor; and
   a first set of transistors in parallel and electrically coupled to the capacitor, wherein the programmable delay unit is configured to turn OFF at least one transistor of the first set of transistors causing the capacitor to take longer to recharge/discharge resulting in the adding of delay by the programmable delay unit to the propagation path of only rising transitions of the third two-state signal.

13. The receiver of claim 12, further comprising a second set of transistors in parallel and electrically coupled to the capacitor, wherein the programmable delay unit is further configured to turn OFF at least one transistor of the second set of transistors causing the capacitor to take longer to recharge/discharge resulting in the adding of delay by the programmable delay unit to the propagation path of only falling transitions of the third two-state signal.

14. A method for interpreting signals sent on a bi-directional, simultaneous transmission line, the method comprising the steps of:

using a first comparator to receive into its positive and negative inputs a three-state digital signal from the transmission line and a first reference voltage level, respectively, and generate a first two-state digital signal, the three-state digital signal having first, second, and third state voltage levels, respectively;

using a second comparator to receive into its positive and negative inputs the three-state digital signal from the transmission line and a second reference voltage level, respectively, and to generate a second two-state digital signal; and using a logic circuit to receive as inputs the first and second two-state digital signals and a third two-state digital signal and generate as an output a fourth two-state digital signal as a function of the first, second, and third two-state digital signals, wherein the first reference voltage level is higher than the second reference voltage level, and the first, second, and third state voltage levels are above the first reference voltage level, between the first and second reference voltage levels, and below the second reference voltage level, respectively.

15. The method of claim 14, further comprises the steps of:

providing a glitch detector electrically coupled to the logic circuit, and a programmable delay unit electrically coupled to the glitch detector; and in response to a glitch on the fourth two-state digital signal, using the glitch detector to cause the programmable delay unit to adjust delay to a propagation path of the third two-state digital signal.

16. The method of claim 15, wherein the step of using the glitch detector to cause the programmable delay unit to adjust delay to a propagation path of the third two-state digital signal comprises the step of using the glitch detector to receive as inputs the first, second, third, and fourth two-state digital signals and generate as an output a fifth control signal to the programmable delay unit, wherein the fifth control signal controls the adding of delay by the programmable delay unit to the propagation path of only rising transitions of the third two-state signal.

17. The method of claim 15, wherein the step of using the glitch detector to cause the programmable delay unit to adjust delay to a propagation path of the third two-state digital signal comprises the step of using the glitch detector to generate as an output a sixth control signal to the programmable delay unit, wherein the sixth control signal controls the adding of delay by the programmable delay unit to the propagation path of only falling transitions of the third two-state signal.

18. The method of claim 15, wherein the step of using the glitch detector to cause the programmable delay unit to adjust delay to a propagation path of the third two-state digital signal comprises the step of using the glitch detector to generate as an output a seventh control signal to the programmable delay unit, wherein the seventh control signal controls the subtracting of delay by the programmable delay unit from the propagation path of only rising transitions of the third two-state signal.

19. The method of claim 15, further comprising the steps of:

providing a capacitor and a first set of transistors in parallel and electrically coupled to the capacitor; and turning OFF at least one transistor of the first set of transistors causing the capacitor to take longer to recharge/discharge so as to perform the adding of delay by the programmable delay unit to the propagation path of only rising transitions of the third two-state signal.

20. The method of claim 19, further comprising the steps of:

providing a second set of transistors in parallel and electrically coupled to the capacitor; and turning OFF at least one transistor of the second set of transistors causing the capacitor to take longer to recharge/discharge so as to perform the adding of delay by the programmable delay unit to the propagation path of only falling transitions of the third two-state signal.

* * * * *